United States Patent
Zhao

(10) Patent No.: US 9,906,222 B2
(45) Date of Patent: Feb. 27, 2018

(54) GATE DRIVING CIRCUIT AND LIQUID CRYSTAL DISPLAY HAVING THE SAME

(71) Applicant: Wuhan China Star Optoelectronics Technology Co., Ltd., Wuhan, Hubei (CN)

(72) Inventor: Mang Zhao, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 230 days.

(21) Appl. No.: 15/023,380

(22) PCT Filed: Feb. 25, 2016

(86) PCT No.: PCT/CN2016/074558
§ 371 (c)(1),
(2) Date: Mar. 19, 2016

(87) PCT Pub. No.: WO2017/128470
PCT Pub. Date: Aug. 3, 2017

(65) Prior Publication Data
US 2018/0034462 A1 Feb. 1, 2018

(30) Foreign Application Priority Data
Jan. 28, 2016 (CN) .......................... 2016 1 0058675

(51) Int. Cl.
*G09G 3/36* (2006.01)
*H03K 17/687* (2006.01)

(52) U.S. Cl.
CPC ....... *H03K 17/6872* (2013.01); *G09G 3/3677* (2013.01)

(58) Field of Classification Search
CPC .... H03K 17/6872; G09G 3/36; G09G 3/3677; G09G 2310/0264; G09G 2310/0286; G09G 3/3674; G11C 19/38; G11C 19/00
See application file for complete search history.

(56) References Cited

U.S. PATENT DOCUMENTS

2008/0062113 A1* 3/2008 Kim ..................... G09G 3/3688
345/100
2009/0185654 A1* 7/2009 Kang ..................... G11C 19/00
377/78

(Continued)

*Primary Examiner* — Premal Patel
(74) *Attorney, Agent, or Firm* — Andrew C. Cheng

(57) ABSTRACT

A gate driving circuit and a liquid crystal display are disclosed. The gate driving circuit includes: an input and latch circuit, a signal processing circuit electrically connected with the input and latch circuit and an output buffering circuit electrically connected with the signal processing circuit. Wherein, the input and latch circuit or the signal processing circuit includes two switch modules which are disposed in parallel. Each switch module includes two switching tubes disposed in series, control terminals of the two switching tubes of one of the two switch modules are crosswise connected with control terminals of the two switching tubes of the other of the two switch modules. The present invention through disposing two switch modules and crosswise connecting the control terminals of the switching tubes, the stress degrees applied on the two switching transistors are the same so as to greatly increase the stability of the circuit operation.

19 Claims, 2 Drawing Sheets

(56) References Cited

U.S. PATENT DOCUMENTS

| | | | |
|---|---|---|---|
| 2009/0256794 A1* | 10/2009 | Jang | G11C 19/28 345/100 |
| 2011/0221736 A1* | 9/2011 | Pak | G09G 3/3677 345/211 |
| 2012/0127138 A1* | 5/2012 | Tsuchi | H03F 1/0261 345/204 |
| 2014/0055334 A1* | 2/2014 | Qing | G09G 3/3611 345/100 |
| 2014/0375360 A1* | 12/2014 | Liu | G02F 1/13306 327/108 |
| 2015/0228354 A1* | 8/2015 | Qing | G11C 19/28 345/100 |
| 2015/0248867 A1* | 9/2015 | Tan | G09G 3/3648 345/100 |
| 2016/0365050 A1* | 12/2016 | Qing | G09G 3/3677 |
| 2017/0169757 A1* | 6/2017 | Kim | G09G 3/2092 |
| 2017/0178560 A1* | 6/2017 | Lee | G09G 3/2092 |

* cited by examiner

GATE DRIVING CIRCUIT AND LIQUID CRYSTAL DISPLAY HAVING THE SAME

BACKGROUND OF THE INVENTION

1. Field of the Invention

The present invention relates to a display technology field, and more particularly to a gate driving circuit and a liquid crystal display having the same.

2. Description of Related Art

The Gate Driver On Array, also called as GOA, is a technology that uses the current array process of the thin-film transistor liquid crystal display to manufacture the Gate row scanning driving signal circuit on the array substrate in order to realize scanning row by row to the Gate.

Along with the development of the Low-temperature polysilicon (LTPS) semiconductor thin-film transistor, because the LTPS semiconductor has an ultra-high carrier mobility feature, the corresponding intergrade circuit surrounded the panel also becomes the focus of everyone's attention, and many people research the System on Panel (SOP) related technology, and gradually become a reality.

In the LTPS technology, a module having CMOS GOA function is usually adopted, including: a latch unit for latching and storing a stage-transferring signal, which is a core part of the GOA circuit design, and mainly formed by two clock-controlled inverters and two inverters; a NAND gate signal processing unit, for performing a NAND process through a CK control signal line and a latched data for generating a control terminal driving signal of a current stage; an output buffer of the CMOS circuit for increasing a driving ability of the control terminal driving signal to reduce a RC loading of a transmission signal.

For the clock-controlled inverters and the NAND gate, a transistor closed to a VGH signal and a VGL signal is defined as a first transistor, and a transistor closed to the output terminal is a second transistor.

The connection way of the circuit of the above two modules is relatively simple. Wherein the stress sustained at the first transistor and the second transistor during a long time operation process are different so that variation degrees of the first transistor and the second transistor are also different. The uniformity of the transistors will cause a variation of latching and storing for the signal and a logic error of the NAND gate, which will seriously affect the normal operation of the circuit and cause the failure of the entire circuit.

SUMMARY OF THE INVENTION

The main technology problem solved by the present invention is to provide a gate driving circuit and a liquid crystal display having the same, which can effectively increase the uniformity of the circuit design and the stability of the circuit operation.

In order to solve above technology problem, a technology solution adopted by the present invention is: a gate driving circuit, comprising:

an input and latch circuit, a signal processing circuit electrically connected with the input and latch circuit and an output buffering circuit electrically connected with the signal processing circuit;

wherein, the input and latch circuit outputs a first control signal according to a scanning driving signal of a previous stage, a first clock signal and a second clock signal phase-inverted with respect to the first clock signal; the signal processing circuit outputs a second control signal according to the first control signal and a third clock signal; the output buffering circuit outputs a scanning driving signal of a current stage according to the second control signal;

wherein, the input and latch circuit or the signal processing circuit includes two switch modules which are disposed in parallel, wherein each switch module includes two switching tubes disposed in series, control terminals of the two switching tubes of one of the two switch modules are crosswise connected with control terminals of the two switching tubes of the other of the two switch modules;

wherein, the input and latch circuit includes: a first clock-controlled inverter, a second clock-controlled inverter and a first inverter; a positive phase control terminal of the first clock-controlled inverter is inputted with the first clock signal, a negative phase control terminal of the first clock-controlled inverter is inputted with the second clock signal; an input terminal of the first clock-controlled inverter is inputted with the scanning driving signal of the previous stage; an output terminal of the first clock-controlled inverter is connected with an output terminal of the second clock-controlled inverter; a positive phase control terminal of the second clock-controlled inverter is inputted with the second clock signal; a negative phase control terminal of the second clock-controlled inverter is inputted with the first clock signal; an input terminal of the first inverter is connected with the output terminal of the first clock-controlled inverter and the output terminal of the second clock-controlled inverter; an output terminal of the first inverter is connected with an input terminal of the second clock-controlled inverter, and outputs the first control signal, wherein, at least one of the first clock-controlled inverter and the second clock-controlled inverter is disposed with the two switch modules connected between at least one output terminal of the first clock-controlled inverter and the second clock-controlled inverter and a reference voltage level; and wherein, the output buffering circuit includes second odd-numbered inverters connected sequentially in series; an input terminal of the second inverters closed to the signal processing circuit is inputted with the second control signal, an output terminal of the second inverters away from the signal processing circuit outputs the scanning driving signal of the current stage.

In order to solve above technology problem, a technology solution adopted by the present invention is: a gate driving circuit, comprising:

an input and latch circuit, a signal processing circuit electrically connected with the input and latch circuit and an output buffering circuit electrically connected with the signal processing circuit;

wherein, the input and latch circuit outputs a first control signal according to a scanning driving signal of a previous stage, a first clock signal and a second clock signal phase-inverted with respect to the first clock signal; the signal processing circuit outputs a second control signal according to the first control signal and a third clock signal; the output buffering circuit outputs a scanning driving signal of a current stage according to the second control signal; and wherein, the input and latch circuit or the signal processing circuit includes two switch modules which are disposed in parallel, wherein each switch module includes two switching tubes disposed in series, control terminals of the two switching tubes of one of the two switch modules are crosswise connected with control terminals of the two switching tubes of the other of the two switch modules.

Wherein, the input and latch circuit includes: a first clock-controlled inverter, a second clock-controlled inverter and a first inverter; a positive phase control terminal of the first clock-controlled inverter is inputted with the first clock signal, a negative phase control terminal of the first clock-controlled inverter is inputted with the second clock signal; an input terminal of the first clock-controlled inverter is inputted with the scanning driving signal of the previous stage; an output terminal of the first clock-controlled inverter is connected with an output terminal of the second clock-controlled inverter; a positive phase control terminal of the second clock-controlled inverter is inputted with the second clock signal; a negative phase control terminal of the second clock-controlled inverter is inputted with the first clock signal; an input terminal of the first inverter is connected with the output terminal of the first clock-controlled inverter and the output terminal of the second clock-controlled inverter; an output terminal of the first inverter is connected with an input terminal of the second clock-controlled inverter, and outputs the first control signal, wherein, at least one of the first clock-controlled inverter and the second clock-controlled inverter is disposed with the two switch modules connected between at least one output terminal of the first clock-controlled inverter and the second clock-controlled inverter and a reference voltage level.

Wherein, the first clock-controlled inverter includes a first P type switching tube, a second P type switching tube, a third P type switching tube, a fourth P type switching tube, a first N type switching tube, a second N type switching tube, a third N type switching tube and a fourth N type switching tube;

a control terminal of the first P type switching tube is connected with a control terminal of the fourth P type switching tube, and is inputted with the second clock signal; a control terminal of the second P type switching tube is connected with a control terminal of the third P type switching tube, and is inputted with the scanning driving signal of the previous stage; a first transmission terminal of the first P type switching tube and a first transmission terminal of the third P type switching tube are inputted with a high voltage reference level; a first transmission terminal of the second P type switching tube is connected with a second transmission terminal of the first P type switching tube; a first transmission terminal of the fourth P type switching tube is connected with a second transmission terminal of the third P type switching tube; a second transmission terminal of the second P type switching tube and a second transmission terminal of the fourth P type switching tube are connected with the output terminal of the first clock-controlled inverter; and a control terminal of the first N type switching tube is connected with a control terminal of the fourth N type switching tube, and is inputted with scanning driving signal of the previous stage; a control terminal of the second N type switching tube is connected with a control terminal of the third N type switching tube, and is inputted with the first clock signal; a first transmission terminal of the second N type switching tube and a first transmission terminal of the fourth N type switching tube are inputted with a low voltage reference level; a first transmission terminal of the first N type switching tube is connected with a second transmission terminal of the second N type switching tube; a first transmission terminal of the third N type switching tube is connected with a second transmission terminal of the fourth N type switching tube; a second transmission terminal of the first N type switching tube and a second transmission terminal of the third N type switching tube are connected with the output terminal of the first clock-controlled inverter.

Wherein, the second clock-controlled inverter includes a fifth P type switching tube, a sixth P type switching tube, a seventh P type switching tube, an eighth P type switching tube, a fifth N type switching tube, a sixth N type switching tube, a seventh N type switching tube, and an eighth N type switching tube;

a control terminal of the fifth P type switching tube is connected with a control terminal of the eighth P type switching tube, and is inputted with the first control signal; a control terminal of the sixth P type switching tube is connected with a control terminal of the seventh P type switching tube, and is inputted with the first clock signal, wherein, a first transmission terminal of the fifth P type switching tube and a first transmission terminal of the seventh P type switching tube are inputted with a high voltage reference level; a first transmission terminal of the sixth P type switching tube is connected with a second transmission terminal of the fifth P type switching tube; a first transmission terminal of the eighth P type switching tube is connected with a second transmission terminal of the seventh P type switching tube; a second transmission terminal of the sixth P type switching tube and a second transmission terminal of the eighth P type switching tube are connected with the output terminal of the second clock-controlled inverter;

a control terminal of the fifth N type switching tube is connected with a control terminal of the eighth N type switching tube, and is inputted with the second clock signal; a control terminal of the sixth N type switching tube is connected with a control terminal of the seventh N type switching tube, and is inputted with the first control signal; a first transmission terminal of the sixth N type switching tube and a first transmission terminal of the eighth N type switching tube are inputted with a low voltage reference level; a first transmission terminal of the fifth N type switching tube is connected with a second transmission terminal of the sixth N type switching tube; a first transmission terminal of the seventh N type switching tube is connected with a second transmission terminal of the eighth N type switching tube; a second transmission terminal of the fifth N type switching tube and a second transmission terminal of the seventh N type switching tube are connected with the output terminal of the second clock-controlled inverter.

Wherein, the signal processing circuit includes a ninth P type switching tube, a tenth P type switching tube, a ninth N type switching tube, a tenth N type switching tube, an eleventh N type switching tube, and a twelfth N type switching tube;

a control terminal of the ninth P type switching tube is inputted with the first control signal, a control terminal of the tenth P type switching tube is inputted with the third clock signal, a first transmission terminal of the ninth P type switching tube and a first transmission terminal of the tenth P type switching tube is inputted with the high reference voltage level, a second transmission of the ninth P type switching tube and a second transmission terminal of the tenth P type switching tube are connected with the output terminal of the NAND gate; and a control terminal of the ninth N type switching tube is connected with a control terminal of the twelfth switching tube, and is inputted with the first control signal; a control terminal of the tenth N type switching tube is connected with a control terminal of the eleventh N type switching tube, and is inputted with the third clock signal; a first transmission terminal of the tenth N type switching tube and a first transmission terminal of the twelfth N type switching tube are inputted with the low voltage reference level; a first transmission terminal of the ninth N type switching tube is connected with a second transmission terminal of the tenth N type switching tube; a first transmission terminal of the eleventh N type switching tube is connected with a second transmission terminal of the twelfth N type switching tube; a second transmission terminal of the ninth N type switching tube and a second transmission terminal of the eleventh N type switching tube are connected with the output terminal of the NAND gate.

Wherein, the signal processing circuit is a NAND gate, a first input terminal of the NAND gate circuit is inputted with the first control signal, a second input terminal of the NAND gate circuit is inputted with the third clock signal, an output terminal of the NAND gate circuit outputs a second control signal, and the NAND gate circuit includes two switching modules disposed among the output terminal of the NAND gate circuit and the reference voltage levels.

Wherein, the signal processing circuits include a first P type switching tube, a second P type switching tube, a first N type switching tube, a second N type switching tube, a third N type switching tube, and a fourth N type switching tube;

a control terminal of the first P type switching tube is inputted with the first control signal, a control terminal of the second P type switching tube is inputted with the third clock signal, a first transmission terminal of the first P type switching tube and a first transmission terminal of the second P type switching tube is inputted with a high reference voltage level, a second transmission of the first P type switching tube and a second transmission terminal of the second P type switching tube are connected with the output terminal of the NAND gate;

a control terminal of the first N type switching tube is connected with a control terminal of the fourth N switching tube, and is inputted with the first control signal; a control terminal of the second N type switching tube is connected with a control terminal of the third N type switching tube, and is inputted with the third clock signal; a first transmission terminal of the second N type switching tube and a first transmission terminal of the fourth N type switching tube are inputted with a low voltage reference level; a first transmission terminal of the first N type switching tube is connected with a second transmission terminal of the second N type switching tube; a first transmission terminal of the third N type switching tube is connected with a second transmission terminal of the fourth N type switching tube; a second transmission terminal of the first N type switching tube and a second transmission terminal of the third N type switching tube are connected with the output terminal of the NAND gate.

Wherein, the output buffering circuit includes second odd-numbered inverters connected sequentially in series; an input terminal of the second inverters closed to the signal processing circuit is inputted with the second control signal, an output terminal of the second inverters away from the signal processing circuit outputs the scanning driving signal of the current stage.

In order to solve above technology problem, the present invention also provides a liquid crystal display including multiple cascade gate driving circuits, and the gate driving circuit comprises: an input and latch circuit, a signal processing circuit electrically connected with the input and latch circuit and an output buffering circuit electrically connected with the signal processing circuit;

wherein, the input and latch circuit outputs a first control signal according to a scanning driving signal of a previous stage, a first clock signal and a second clock signal phase-inverted with respect to the first clock signal; the signal processing circuit outputs a second control signal according to the first control signal and a third clock signal; the output buffering circuit outputs a scanning driving signal of a current stage according to the second control signal; and wherein, the input and latch circuit or the signal processing circuit includes two switch modules which are disposed in parallel, wherein each switch module includes two switching tubes disposed in series, control terminals of the two switching tubes of one of the two switch modules are crosswise connected with control terminals of the two switching tubes of the other of the two switch modules.

Wherein, the input and latch circuit includes: a first clock-controlled inverter, a second clock-controlled inverter and a first inverter; a positive phase control terminal of the first clock-controlled inverter is inputted with the first clock signal, a negative phase control terminal of the first clock-controlled inverter is inputted with the second clock signal; an input terminal of the first clock-controlled inverter is inputted with the scanning driving signal of the previous stage; an output terminal of the first clock-controlled inverter is connected with an output terminal of the second clock-controlled inverter; a positive phase control terminal of the second clock-controlled inverter is inputted with the second clock signal; a negative phase control terminal of the second clock-controlled inverter is inputted with the first clock signal; an input terminal of the first inverter is connected with the output terminal of the first clock-controlled inverter and the output terminal of the second clock-controlled inverter; an output terminal of the first inverter is connected with an input terminal of the second clock-controlled inverter, and outputs the first control signal, wherein, at least one of the first clock-controlled inverter and the second clock-controlled inverter is disposed with the two switch modules connected between at least one output terminal of the first clock-controlled inverter and the second clock-controlled inverter and a reference voltage level.

Wherein, the first clock-controlled inverter includes a first P type switching tube, a second P type switching tube, a third P type switching tube, a fourth P type switching tube, a first N type switching tube, a second N type switching tube, a third N type switching tube and a fourth N type switching tube;

a control terminal of the first P type switching tube is connected with a control terminal of the fourth P type switching tube, and is inputted with the second clock signal; a control terminal of the second P type switching tube is connected with a control terminal of the third P type switching tube, and is inputted with the scanning driving signal of the previous stage; a first transmission terminal of the first P type switching tube and a first transmission terminal of the third P type switching tube are inputted with a high voltage reference level; a first transmission terminal of the second P type switching tube is connected with a second transmission terminal of the first P type switching tube; a first transmission terminal of the fourth P type switching tube is connected with a second transmission terminal of the third P type switching tube; a second transmission terminal of the second P type switching tube and a second transmission terminal of the fourth P type switching tube are connected with the output terminal of the first clock-controlled inverter; and a control terminal of the first N type switching tube is connected with a control terminal of the fourth N type switching tube, and is inputted with scanning driving signal of the previous stage; a control terminal of the second N type switching tube is connected with a control terminal of the third N type switching tube, and is inputted with the first clock signal; a first transmission terminal of the second N type switching tube and a first transmission terminal of the fourth N type switching tube are inputted with a low voltage reference level; a first transmission terminal of the first N type switching tube is connected with a second transmission terminal of the second N type switching tube; a first transmission terminal of the third N type switching tube is connected with a second transmission terminal of the fourth N type switching tube; a second transmission terminal of the first N type switching tube and a second transmission terminal of the third N type switching tube are connected with the output terminal of the first clock-controlled inverter.

Wherein, the second clock-controlled inverter includes a fifth P type switching tube, a sixth P type switching tube, a seventh P type switching tube, an eighth P type switching tube, a fifth N type switching tube, a sixth N type switching tube, a seventh N type switching tube, and an eighth N type switching tube;

a control terminal of the fifth P type switching tube is connected with a control terminal of the eighth P type switching tube, and is inputted with the first control signal; a control terminal of the sixth P type switching tube is connected with a control terminal of the seventh P type switching tube, and is inputted with the first clock signal, wherein, a first transmission terminal of the fifth P type switching tube and a first transmission terminal of the seventh P type switching tube are inputted with a high voltage reference level; a first transmission terminal of the sixth P type switching tube is connected with a second transmission terminal of the fifth P type switching tube; a first transmission terminal of the eighth P type switching tube is connected with a second transmission terminal of the seventh P type switching tube; a second transmission terminal of the sixth P type switching tube and a second transmission terminal of the eighth P type switching tube are connected with the output terminal of the second clock-controlled inverter;

a control terminal of the fifth N type switching tube is connected with a control terminal of the eighth N type switching tube, and is inputted with the second clock signal; a control terminal of the sixth N type switching tube is connected with a control terminal of the seventh N type switching tube, and is inputted with the first control signal; a first transmission terminal of the sixth N type switching tube and a first transmission terminal of the eighth N type switching tube are inputted with a low voltage reference level; a first transmission terminal of the fifth N type switching tube is connected with a second transmission terminal of the sixth N type switching tube; a first transmission terminal of the seventh N type switching tube is connected with a second transmission terminal of the eighth N type switching tube; a second transmission terminal of the fifth N type switching tube and a second transmission terminal of the seventh N type switching tube are connected with the output terminal of the second clock-controlled inverter.

Wherein, the signal processing circuit includes a ninth P type switching tube, a tenth P type switching tube, a ninth N type switching tube, a tenth N type switching tube, an eleventh N type switching tube, and a twelfth N type switching tube;

a control terminal of the ninth P type switching tube is inputted with the first control signal, a control terminal of the tenth P type switching tube is inputted with the third clock signal, a first transmission terminal of the ninth P type switching tube and a first transmission terminal of the tenth P type switching tube is inputted with the high reference voltage level, a second transmission of the ninth P type switching tube and a second transmission terminal of the tenth P type switching tube are connected with the output terminal of the NAND gate; and a control terminal of the ninth N type switching tube is connected with a control terminal of the twelfth switching tube, and is inputted with the first control signal; a control terminal of the tenth N type switching tube is connected with a control terminal of the eleventh N type switching tube, and is inputted with the third clock signal; a first transmission terminal of the tenth N type switching tube and a first transmission terminal of the twelfth N type switching tube are inputted with the low voltage reference level; a first transmission terminal of the ninth N type switching tube is connected with a second transmission terminal of the tenth N type switching tube; a first transmission terminal of the eleventh N type switching tube is connected with a second transmission terminal of the twelfth N type switching tube; a second transmission terminal of the ninth N type switching tube and a second transmission terminal of the eleventh N type switching tube are connected with the output terminal of the NAND gate.

Wherein, the signal processing circuit is a NAND gate, a first input terminal of the NAND gate circuit is inputted with the first control signal, a second input terminal of the NAND gate circuit is inputted with the third clock signal, an output terminal of the NAND gate circuit outputs a second control signal, and the NAND gate circuit includes two switching modules disposed among the output terminal of the NAND gate circuit and the reference voltage levels.

Wherein, the signal processing circuits include a first P type switching tube, a second P type switching tube, a first N type switching tube, a second N type switching tube, a third N type switching tube, and a fourth N type switching tube;

a control terminal of the first P type switching tube is inputted with the first control signal, a control terminal of the second P type switching tube is inputted with the third clock signal, a first transmission terminal of the first P type switching tube and a first transmission terminal of the second P type switching tube is inputted with a high reference voltage level, a second transmission of the first P type switching tube and a second transmission terminal of the second P type switching tube are connected with the output terminal of the NAND gate;

a control terminal of the first N type switching tube is connected with a control terminal of the fourth N switching tube, and is inputted with the first control signal; a control terminal of the second N type switching tube is connected with a control terminal of the third N type switching tube, and is inputted with the third clock signal; a first transmission terminal of the second N type switching tube and a first transmission terminal of the fourth N type switching tube are inputted with a low voltage reference level; a first transmission terminal of the first N type switching tube is connected with a second transmission terminal of the second N type switching tube; a first transmission terminal of the third N type switching tube is connected with a second transmission terminal of the fourth N type switching tube; a second transmission terminal of the first N type switching tube and a second transmission terminal of the third N type switching tube are connected with the output terminal of the NAND gate.

Wherein, the output buffering circuit includes second odd-numbered inverters connected sequentially in series; an input terminal of the second inverters closed to the signal processing circuit is inputted with the second control signal, an output terminal of the second inverters away from the signal processing circuit outputs the scanning driving signal of the current stage.

The beneficial effect of the present invention is: comparing with the conventional art, the present invention through disposing two switch modules and crosswise connecting the control terminals of the switching tubes, the stress degrees applied on the two switching transistors are the same so as to greatly increase the stability of the circuit operation.

DETAILED DESCRIPTION OF THE PREFERRED EMBODIMENT

In the embodiment and claims of the present invention, some vocabularies are used to indicate some specific elements. A person skilled in the art can understand that manufacturers may use a different vocabulary to indicate a same element. The present embodiment and claims do not use the difference in the vocabularies to distinguish the elements. The present embodiment and claims utilize the difference in the functions of the elements to distinguish the elements. The following content combines with the drawings and the embodiment for describing the present invention in detail.

Figure 1:
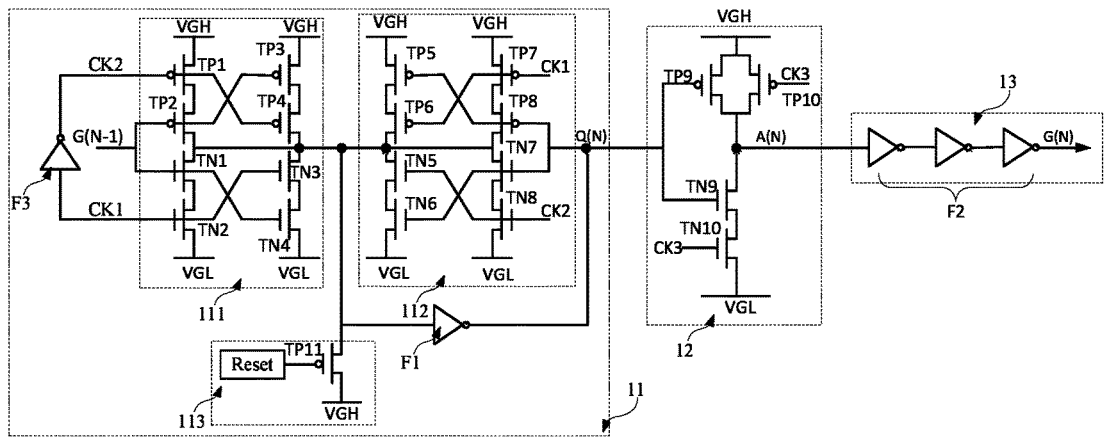
FIG. 1 is a schematic circuit structure diagram of a gate driving circuit of a first embodiment of the present invention.

With reference to FIG. 1, and FIG. 1 is a schematic circuit structure diagram of a gate driving circuit of a first embodiment of the present invention. The gate driving circuit includes: an input and latch circuit 11, a signal processing circuit 12 electrically connected with the input and latch circuit 11 and an output buffering circuit 13 electrically connected with the signal processing circuit 12.

The input and latch circuit 11 outputs a first control signal Q(N) according to a scanning driving signal G(N−1) of a previous stage, a first clock signal CK1 and a second clock signal CK2 phase-inverted with respect to the first clock signal CK1. The signal processing circuit 12 outputs a second control signal A(N) according to the first control signal Q(N) and a third clock signal CK3. The output buffering circuit 13 outputs a scanning driving signal G(N) of a current stage according to the second control signal A(N).

Wherein, the input and latch circuit 11 or the signal processing circuit 12 includes two switch modules which are disposed in parallel, wherein each switch module includes two switching tubes disposed in series. Control terminals of the two switching tubes of one of the two switch modules are crosswise connected with control terminals of the two switching tubes of the other of the two switch modules.

Wherein, the input and latch circuit 11 includes: a first clock-controlled inverter 111, a second clock-controlled inverter 112 and a first inverter F1. A positive phase control terminal of the first clock-controlled inverter 111 is inputted with the first clock signal CK1, a negative phase control terminal of the first clock-controlled inverter 111 is inputted with the second clock signal CK2. An input terminal of the first clock-controlled inverter 111 is inputted with the scanning driving signal G(N−1) of the previous stage. An output terminal of the first clock-controlled inverter 111 is connected with an output terminal of the second clock-controlled inverter 112. A positive phase control terminal of the second clock-controlled inverter 112 is inputted with the second clock signal CK2. A negative phase control terminal of the second clock-controlled inverter 112 is inputted with the first clock signal CK1.

An input terminal of the first inverter F1 is connected with the output terminal of the first clock-controlled inverter 111 and the output terminal of the second clock-controlled inverter 112. An output terminal of the first inverter F1 is connected with an input terminal of the second clock-controlled inverter 112, and outputs the first control signal Q(N), wherein, at least one of the first clock-controlled inverter 111 and the second clock-controlled inverter 112 is disposed with the two switch modules connected between at least one output terminal of the first clock-controlled inverter 111 and the second clock-controlled inverter 112 and a reference voltage level.

Wherein, the first clock-controlled inverter 111 includes a first P type switching tube TP1, a second P type switching tube TP2, a third P type switching tube TP3, a fourth P type switching tube TP4, a first N type switching tube TN1, a second N type switching tube TN2, a third N type switching tube TN3 and a fourth N type switching tube TN4; a control terminal of the first P type switching tube TP1 is connected with a control terminal of the fourth P type switching tube TP4, and is inputted with the second clock signal CK2. A control terminal of the second P type switching tube TP2 is connected with a control terminal of the third P type switching tube TP3, and is inputted with the scanning driving signal G(N−1) of the previous stage. A first transmission terminal of the first P type switching tube TP1 and a first transmission terminal of the third P type switching tube TP3 are inputted with a high voltage reference level VGH. A first transmission terminal of the second P type switching tube TP2 is connected with a second transmission terminal of the first P type switching tube TP1. A first transmission terminal of the fourth P type switching tube TP4 is connected with a second transmission terminal of the third P type switching tube TP3. A second transmission terminal of the second P type switching tube TP2 and a second transmission terminal of the fourth P type switching tube TP4 are connected with the output terminal of the first clock-controlled inverter 111.

A control terminal of the first N type switching tube TN1 is connected with a control terminal of the fourth N type switching tube TN4, and is inputted with scanning driving signal G(N−1) of the previous stage. A control terminal of the second N type switching tube TN2 is connected with a control terminal of the third N type switching tube TN3, and is inputted with the first clock signal CK1. A first transmission terminal of the second N type switching tube TN2 and a first transmission terminal of the fourth N type switching tube TP4 are inputted with a low voltage reference level VGL. A first transmission terminal of the first N type switching tube TN1 is connected with a second transmission terminal of the second N type switching tube TN2. A first transmission terminal of the third N type switching tube TN3 is connected with a second transmission terminal of the fourth N type switching tube TN4. A second transmission terminal of the first N type switching tube TN1 and a second transmission terminal of the third N type switching tube TN3 are connected with the output terminal of the first clock-controlled inverter 111.

Wherein, the second clock-controlled inverter 112 includes a fifth P type switching tube TP5, a sixth P type switching tube TP6, a seventh P type switching tube TP7, an eighth P type switching tube TP8, a fifth N type switching tube TN5, a sixth N type switching tube TN6, a seventh N type switching tube TN7, and an eighth N type switching tube TN8.

A control terminal of the fifth P type switching tube TP5 is connected with a control terminal of the eighth P type switching tube TP8, and is inputted with the first control signal Q(N). A control terminal of the sixth P type switching tube TP6 is connected with a control terminal of the seventh P type switching tube TP7, and is inputted with the first clock signal CK1. Wherein, a first transmission terminal of the fifth P type switching tube TP5 and a first transmission terminal of the seventh P type switching tube TP7 are inputted with a high voltage reference level VGH. A first transmission terminal of the sixth P type switching tube TP6 is connected with a second transmission terminal of the fifth P type switching tube TP5. A first transmission terminal of the eighth P type switching tube TP8 is connected with a second transmission terminal of the seventh P type switching tube TP7. A second transmission terminal of the sixth P type switching tube TP6 and a second transmission terminal of the eighth P type switching tube TP8 are connected with the output terminal of the second clock-controlled inverter 112.

A control terminal of the fifth N type switching tube TN5 is connected with a control terminal of the eighth N type switching tube TN8, and is inputted with the second clock signal CK2. A control terminal of the sixth N type switching tube TN6 is connected with a control terminal of the seventh N type switching tube TN7, and is inputted with the first control signal Q(N). A first transmission terminal of the sixth N type switching tube TN6 and a first transmission terminal of the eighth N type switching tube TP8 are inputted with a low voltage reference level VGL. A first transmission terminal of the fifth N type switching tube TN5 is connected with a second transmission terminal of the sixth N type switching tube TN6. A first transmission terminal of the seventh N type switching tube TN7 is connected with a second transmission terminal of the eighth N type switching tube TN8. A second transmission terminal of the fifth N type switching tube TN5 and a second transmission terminal of the seventh N type switching tube TN7 are connected with the output terminal of the second clock-controlled inverter 112.

Wherein, the signal processing circuit 12 is a NAND gate. A first input terminal of the NAND gate circuit is inputted with the first control signal Q(N), a second input terminal of the NAND gate circuit is inputted with the third clock signal CK3, an output terminal of the NAND gate circuit outputs a second control signal A(N), and the NAND gate circuit includes two switching modules disposed among the output terminal of the NAND gate circuit and the reference voltage levels.

Figure 4:
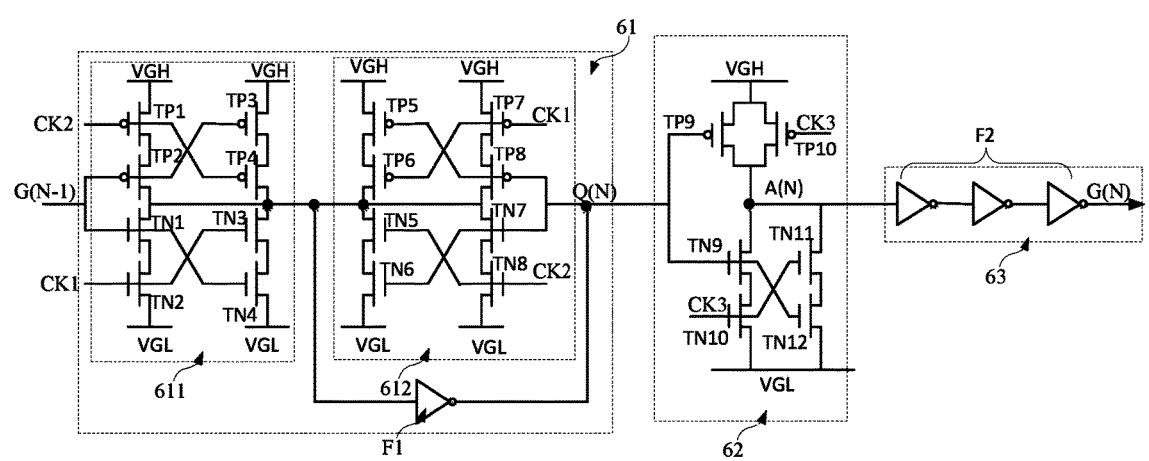
FIG. 4 is a schematic circuit structure diagram of a gate driving circuit of a third embodiment of the present invention.

With combined reference to FIG. 4, the signal processing circuits 12 and 62 include a ninth P type switching tube TP9, a tenth P type switching tube TP10, a ninth N type switching tube TN9, a tenth N type switching tube TN10, an eleventh N type switching tube TN11, and a twelfth N type switching tube TN12.

A control terminal of the ninth P type switching tube TP9 is inputted with the first control signal Q(N), a control terminal of the tenth P type switching tube TP10 is inputted with the third clock signal CK3, a first transmission terminal of the ninth P type switching tube TP9 and a first transmission terminal of the tenth P type switching tube TP10 is inputted with the high reference voltage level VGH, a second transmission of the ninth P type switching tube TP9 and a second transmission terminal of the tenth P type switching tube TP10 are connected with the output terminal of the NAND gate.

A control terminal of the ninth N type switching tube TN9 is connected with a control terminal of the twelfth switching tube TN12, and is inputted with the first control signal Q(N). A control terminal of the tenth N type switching tube TN10 is connected with a control terminal of the eleventh N type switching tube TN11, and is inputted with the third clock signal CK3. A first transmission terminal of the tenth N type switching tube TN10 and a first transmission terminal of the twelfth N type switching tube TN12 are inputted with the low voltage reference level VGL. A first transmission terminal of the ninth N type switching tube TN9 is connected with a second transmission terminal of the tenth N type switching tube TN10. A first transmission terminal of the eleventh N type switching tube TN11 is connected with a second transmission terminal of the twelfth N type switching tube TN12. A second transmission terminal of the ninth N type switching tube TN9 and a second transmission terminal of the eleventh N type switching tube TN11 are connected with the output terminal of the NAND gate.

Wherein, the output buffering circuit 13 includes second odd-numbered inverters F2 connected sequentially in series. An input terminal of the second inverters F2 closed to the signal processing circuit 12 is inputted with the second control signal A(N), an output terminal of the second inverters F2 away from the signal processing circuit 12 outputs the scanning driving signal G(N) of the current stage.

Wherein, each of the switching tube can be a thin-film transistor TFT, the control terminal is a gate electrode of the thin-film transistor, the first transmission terminal and the second transmission terminal are respectively a source electrode and a drain electrode.

Figure 2:
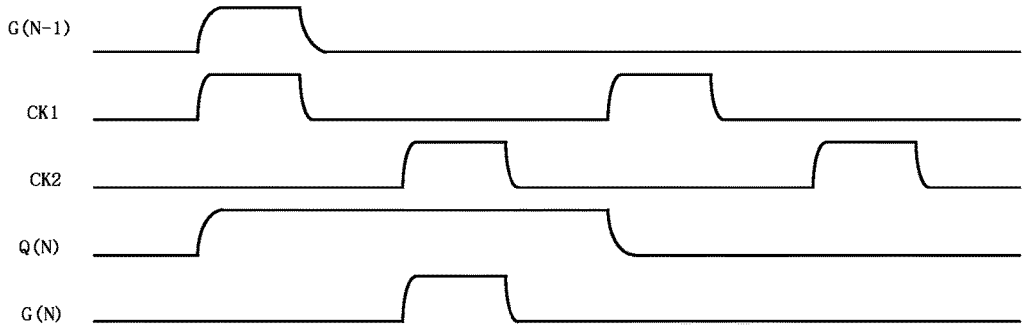
FIG. 2 is a timing diagram of the gate driving circuit of the present invention.

FIG. 2 is a timing diagram of the gate driving circuit of the present invention. Combined with FIG. 1 and FIG. 2, when the scanning driving signal G(N−1) of the previous stage generates a high voltage level, the first clock signal CK1 is also a high voltage level signal, and the second clock signal CK2 is a low voltage level signal. The first P type switching tube TP 1 and the fourth P type switching tube TP4 are turned on, the first N type switching tube TN1 and the fourth N type switching tube TN4 are turned on, the second N type switching tube TN2 and the third N type switching tube TN3 are turned on. A voltage at a connection node of the second transmission terminal of the fourth P type switching tube TP4 and the second transmission terminal of the third N type switching tube TN3 is equal to the constant low voltage level signal VGL. After passing through the first inverter F1 to be inverted, the first control signal Q(N) is obtained. At this time, the first control signal Q(N) is a high voltage level signal;

when the first clock signal CK1 becomes a low voltage level signal, the scanning driving signal G(N−1) of the previous stage also becomes a low voltage level signal. At this time, the first clock-controlled inverter 111 does not work. The sixth N type switching tube TN6 and the seventh N type switching tube TN7 in the second clock-controlled inverter 112 are turned on, the sixth P type switching tube TP6 and the seventh P type switching tube TP7 are turned on, the fifth N type switching tube TN5 and the eighth N type switching tube TN8 are turned on, and the voltage at the connection node of the second transmission terminals of the fourth P type switching tube TP4 and the third N type switching tube TN3 is latched at the low reference voltage level VGL; when the third clock signal CK3 generates a high voltage level, the ninth N type switching tube TN9 and the tenth N type switching tube TN10 in the signal processing circuit 12 are turned on. At this time, the second control signal A(N) is a low voltage level signal, after through the phase inverting function of the second odd-numbered (FIG. 3 only shows three second inverters) inverters F2 connected sequentially in series, outputting the scanning driving signal G(N) of the current stage having a high voltage level.

In the present embodiment, because in the input and latch circuit 11, original one clock-controlled inverter is divide into two, and the two clock-controlled inverters are connected crosswise, the stress degrees applied on the transistors closed to the VGH and VGL, and the transistor (equivalent) closed to the output terminal are the same so as to increase the uniformity of the circuit design and the stability of the circuit operation.

In a preferred embodiment of the present invention, the input and latch circuit 11 further includes a third inverter F3, the second clock signal CK2 is obtained by inverting the phase of the first clock signal CK1 through the third inverter F3.

In a preferred embodiment of the present invention, the input and latch circuit 11 further includes a reset circuit 113, and the reset circuit 113 has an eleventh P type switching tube TP11. A control terminal of the eleventh P type switching tube TP11 is inputted with a reset signal Reset. A first transmission terminal is inputted with the high reference voltage level VGH, a second transmission terminal is connected with the output terminals of the first clock-controlled inverter 111 and the second clock-controlled inverter 112.

Figure 3:
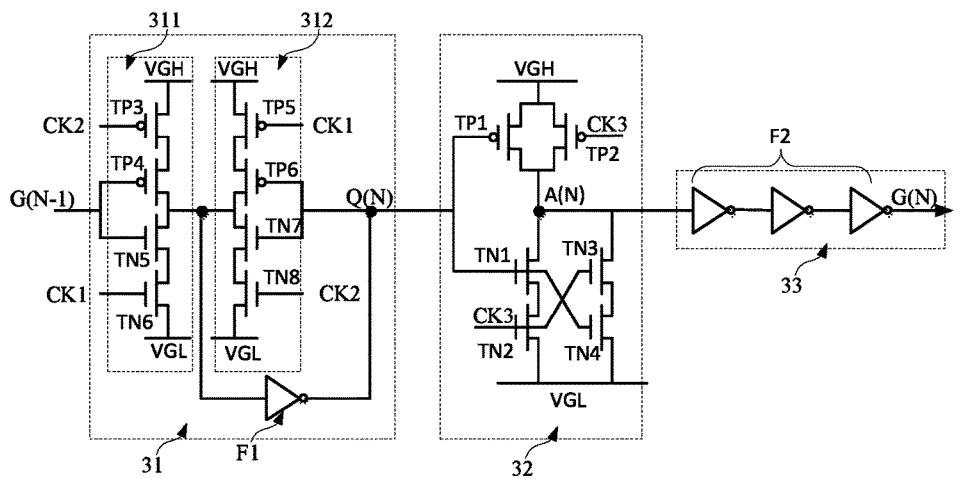
FIG. 3 is a schematic circuit structure diagram of a gate driving circuit of a second embodiment of the present invention.

With reference to FIG. 3, FIG. 3 is a schematic circuit structure diagram of a gate driving circuit of a second embodiment of the present invention. The gate driving circuit includes: an input and latch circuit 31, a signal processing circuit 32 electrically connected with the input and latch circuit 31, an output buffering circuit 33 electrically connected with the signal processing circuit 32.

The input and latch circuit 31 outputs a first control signal Q(N) according to a scanning driving signal G(N−1) of a previous stage, a first clock signal CK1 and a second clock signal CK2 phase-inverted with respect to a first clock signal CK1. The signal processing circuit 32 outputs a second control signal A(N) according to the first control signal Q(N) and a third clock signal CK3. The output buffering circuit 33 outputs a scanning driving signal G(N) of a current stage according to the second control signal A(N).

Wherein, the signal processing circuit 32 is a NAND gate. A first input terminal of the NAND circuit is inputted with the first control signal Q(N), a second input terminal of the NAND circuit is inputted with the third clock signal CK3, an output terminal of the NAND circuit outputs the second control signal A(N), and the NAND circuit includes two switching modules disposed among the output terminal of the NAND circuit and the reference voltage levels.

Wherein, the signal processing circuits 32 include a first P type switching tube TP1, a second P type switching tube TP2, a first N type switching tube TN1, a second N type switching tube TN2, a third N type switching tube TN3, and a fourth N type switching tube TN4.

A control terminal of the first P type switching tube TP1 is inputted with the first control signal Q(N), a control terminal of the second P type switching tube TP2 is inputted with the third clock signal CK3, a first transmission terminal of the first P type switching tube TP1 and a first transmission terminal of the second P type switching tube TP2 is inputted with the high reference voltage level VGH, a second transmission of the first P type switching tube TP1 and a second transmission terminal of the second P type switching tube TP2 are connected with the output terminal of the NAND gate.

A control terminal of the first N type switching tube TN1 is connected with a control terminal of the fourth N switching tube TN4, and is inputted with the first control signal Q(N). A control terminal of the second N type switching tube TN2 is connected with a control terminal of the third N type switching tube TN3, and is inputted with the third clock signal CK3. A first transmission terminal of the second N type switching tube TN2 and a first transmission terminal of the fourth N type switching tube TN4 are inputted with the low voltage reference level VGL. A first transmission terminal of the first N type switching tube TN1 is connected with a second transmission terminal of the second N type switching tube TN2. A first transmission terminal of the third N type switching tube TN3 is connected with a second transmission terminal of the fourth N type switching tube TN4. A second transmission terminal of the first N type switching tube TN1 and a second transmission terminal of the third N type switching tube TN3 are connected with the output terminal of the NAND gate.

The input and latch circuit 31 includes: a first clock-controlled inverter 311, a second clock-controlled inverter 312 and a first inverter F1. A positive phase control terminal of the first clock-controlled inverter 311 is inputted with the first clock signal CK1, a negative phase control terminal of the first clock-controlled inverter 311 is inputted with the second clock signal CK2, an input terminal of the first clock-controlled inverter 311 is inputted with the scanning driving signal G(N−1) of the previous stage, an output terminal of the first clock-controlled inverter 311 is connected with an output terminal of the second clock-controlled inverter 312. A positive phase control terminal of the second clock-controlled inverter 312 is inputted with the second clock signal CK2, a negative phase control terminal of the second clock-controlled inverter 312 is inputted with the first clock signal CK1. An input terminal of the inverter F1 is connected with the output terminal of the first clock-controlled inverter 311 and an output terminal of the second clock-controlled inverter 312. An output terminal of the first inverter F1 is connected with an input terminal of the second clock-controlled inverter 312, and outputs the first control signal CK1.

Wherein, the first clock-controlled inverter 311 includes a third P type switching tube TP3, a fourth P type switching tube TP4, a fifth N type switching tube TN5 and a sixth N type switching tube TN6.

A control terminal of the third P type switching tube TP3 is inputted with the second clock signal CK2, a first transmission terminal of the switching tube TP3 is inputted with the high reference voltage level VGH, and a second terminal of the switching tube TP3 is connected with a first transmission terminal of the second P type switching tube TP2; a control terminal of the fourth P type switching tube TP4 is inputted with the scanning driving signal G(N−1) of the previous stage. A second transmission terminal of the fourth P type switching tube TP4 and a second transmission terminal of the fifth N type switching tube TN5 are connected with the output terminal of the first clock-controlled inverter 311; a control terminal of the fifth N type switching tube TN5 is inputted with the scanning driving signal G(N−1) of the previous stage, a first transmission terminal of the switching tube TN5 is connected with a second transmission terminal of the sixth N type switching tube TN6; a control terminal of the sixth N type switching tube TN6 is inputted with the first clock signal CK1, a first transmission terminal of the sixth N type switching tube TN6 is inputted with the low reference voltage level VGL.

The second clock-controlled inverter 312 includes a fifth P type switching tube TP5, a sixth P type switching tube TP6, a seventh N type switching tube TN7 and an eighth N type switching tube TN8.

A control terminal of the fifth P type switching tube TP5 is inputted with the first clock signal CK1, a first transmission terminal of the switching tube TP5 is inputted with the high reference voltage level VGH, and a second terminal of the switching tube TP5 is connected with a first transmission terminal of the sixth P type switching tube TP6; a control terminal of the sixth P type switching tube TP6 is inputted with the first control signal Q(N), a second transmission terminal of the sixth P type switching tube TP6 and a second transmission terminal of the seventh N type switching tube TN7 are connected with the output terminal of the second clock-controlled inverter 312; a control terminal of the seventh N type switching tube TN7 is inputted with the first control signal Q(N), a first transmission terminal of the switching tube TN7 is connected with a second transmission terminal of the eighth N type switching tube TN8; a control terminal of the eighth N type switching tube TN8 is inputted with the second clock signal CK2, a first transmission terminal of the eighth N type switching tube TN8 is inputted with the low reference voltage level VGL.

Wherein, the output buffering circuit 33 includes second odd-numbered inverters F2 connected sequentially in series. An input terminal of the second inverters F2 closed to the signal processing circuit 32 is inputted with the second control signal A(N), an output terminal of the second inverters F2 away from the signal processing circuit 32 outputs the scanning driving signal G(N) of the current stage.

With combined reference to FIG. 2 and FIG. 3, when third clock control signal CK3 generates a high voltage level, the first control signal Q(N) is also at a high voltage level. The first N type switching tube TN1, the fourth N type switching tube TN4, the second N type switching tube TN2, and the third N type switching tube TN3 in the signal processing circuit 32 are all turned on, the outputted second control signal A(N) is a low voltage level signal.

In the present embodiment, because in the signal processing circuit 32, original NAND gate is divide into two, and the two NAND gates are connected crosswise, the stress degrees applied on the transistors closed to the VGL, and the transistor (equivalent) closed to the output point of the second control signal A(N) are the same so as to increase the uniformity of the circuit design and the stability of the circuit operation.

With reference to FIG. 4, the second embodiment of the gate driving circuit of the present invention can also combine with the first embodiment in order to form a third embodiment of the gate driving circuit of the present invention. The specific structure and circuit operation principle are already described in detail in the above embodiments, no more repeating.

Figure 5:
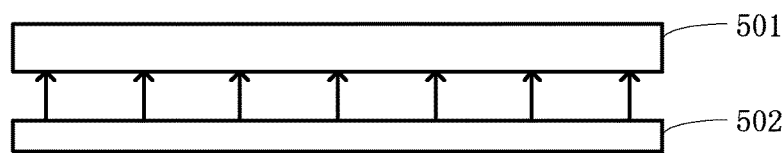
FIG. 5 is a schematic structure diagram of a first embodiment of a liquid crystal display of the present invention.

With reference to FIG. 5, the present invention also provides a schematic structure diagram of an embodiment of a liquid crystal display. The liquid crystal display includes a display panel 701 and a backlight 702. The display panel 701 includes multiple cascade gate driving circuit, and the specific embodiment is similar, no more repeating.

Besides, the gate driving circuit in the embodiment of the present invention is not limited to be applied at the liquid crystal display. The person skilled in the art can understand that the gate driving circuit can also be applied at OLED display panel, or applied at cell phone, display device, and television gate driving field.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A gate driving circuit, comprising:
an input and latch circuit, a signal processing circuit electrically connected with the input and latch circuit and an output buffering circuit electrically connected with the signal processing circuit;
wherein, the input and latch circuit outputs a first control signal according to a scanning driving signal of a previous stage, a first clock signal and a second clock signal phase-inverted with respect to the first clock signal; the signal processing circuit outputs a second control signal according to the first control signal and a third clock signal; the output buffering circuit outputs a scanning driving signal of a current stage according to the second control signal;
wherein, the input and latch circuit or the signal processing circuit includes two switch modules which are disposed in parallel, wherein each switch module includes two switching tubes disposed in series, control terminals of the two switching tubes of one of the two switch modules are crosswise connected with control terminals of the two switching tubes of the other of the two switch modules;
wherein, the input and latch circuit includes: a first clock-controlled inverter, a second clock-controlled inverter and a first inverter; a positive phase control terminal of the first clock-controlled inverter is inputted with the first clock signal, a negative phase control terminal of the first clock-controlled inverter is inputted with the second clock signal; an input terminal of the first clock-controlled inverter is inputted with the scanning driving signal of the previous stage; an output terminal of the first clock-controlled inverter is connected with an output terminal of the second clock-controlled inverter; a positive phase control terminal of the second clock-controlled inverter is inputted with the second clock signal; a negative phase control terminal of the second clock-controlled inverter is inputted with the first clock signal; an input terminal of the first inverter is connected with the output terminal of the first clock-controlled inverter and the output terminal of the second clock-controlled inverter; an output terminal of the first inverter is connected with an input terminal of the second clock-controlled inverter, and outputs the first control signal, wherein, at least one of the first clock-controlled inverter and the second clock-controlled inverter is disposed with the two switch modules connected between at least one output terminal of the first clock-controlled inverter and the second clock-controlled inverter and a reference voltage level; and wherein, the output buffering circuit includes second odd-numbered inverters connected sequentially in series; an input terminal of the second inverters close to the signal processing circuit is inputted with the second control signal, an output terminal of the second inverters away from the signal processing circuit outputs the scanning driving signal of the current stage.

2. A gate driving circuit, comprising:

an input and latch circuit, a signal processing circuit electrically connected with the input and latch circuit and an output buffering circuit electrically connected with the signal processing circuit;

wherein, the input and latch circuit outputs a first control signal according to a scanning driving signal of a previous stage, a first clock signal and a second clock signal phase-inverted with respect to the first clock signal; the signal processing circuit outputs a second control signal according to the first control signal and a third clock signal; the output buffering circuit outputs a scanning driving signal of a current stage according to the second control signal; and wherein, the input and latch circuit or the signal processing circuit includes two switch modules which are disposed in parallel, wherein each switch module includes two switching tubes disposed in series, control terminals of the two switching tubes of one of the two switch modules are crosswise connected with control terminals of the two switching tubes of the other of the two switch modules.

3. The gate driving circuit according to claim 2, wherein, the input and latch circuit includes: a first clock-controlled inverter, a second clock-controlled inverter and a first inverter;

a positive phase control terminal of the first clock-controlled inverter is inputted with the first clock signal, a negative phase control terminal of the first clock-controlled inverter is inputted with the second clock signal; an input terminal of the first clock-controlled inverter is inputted with the scanning driving signal of the previous stage; an output terminal of the first clock-controlled inverter is connected with an output terminal of the second clock-controlled inverter; a positive phase control terminal of the second clock-controlled inverter is inputted with the second clock signal; a negative phase control terminal of the second clock-controlled inverter is inputted with the first clock signal; an input terminal of the first inverter is connected with the output terminal of the first clock-controlled inverter and the output terminal of the second clock-controlled inverter; an output terminal of the first inverter is connected with an input terminal of the second clock-controlled inverter, and outputs the first control signal, wherein, at least one of the first clock-controlled inverter and the second clock-controlled inverter is disposed with the two switch modules connected between at least one output terminal of the first clock-controlled inverter and the second clock-controlled inverter and a reference voltage level.

4. The gate driving circuit according to claim 3, wherein, the first clock-controlled inverter includes a first P type switching tube, a second P type switching tube, a third P type switching tube, a fourth P type switching tube, a first N type switching tube, a second N type switching tube, a third N type switching tube and a fourth N type switching tube;

a control terminal of the first P type switching tube is connected with a control terminal of the fourth P type switching tube, and is inputted with the second clock signal; a control terminal of the second P type switching tube is connected with a control terminal of the third P type switching tube, and is inputted with the scanning driving signal of the previous stage; a first transmission terminal of the first P type switching tube and a first transmission terminal of the third P type switching tube are inputted with a high voltage reference level; a first transmission terminal of the second P type switching tube is connected with a second transmission terminal of the first P type switching tube; a first transmission terminal of the fourth P type switching tube is connected with a second transmission terminal of the third P type switching tube; a second transmission terminal of the second P type switching tube and a second transmission terminal of the fourth P type switching tube are connected with the output terminal of the first clock-controlled inverter; and a control terminal of the first N type switching tube is connected with a control terminal of the fourth N type switching tube, and is inputted with scanning driving signal of the previous stage; a control terminal of the second N type switching tube is connected with a control terminal of the third N type switching tube, and is inputted with the first clock signal; a first transmission terminal of the second N type switching tube and a first transmission terminal of the fourth N type switching tube are inputted with a low voltage reference level; a first transmission terminal of the first N type switching tube is connected with a second transmission terminal of the second N type switching tube; a first transmission terminal of the third N type switching tube is connected with a second transmission terminal of the fourth N type switching tube; a second transmission terminal of the first N type switching tube and a second transmission terminal of the third N type switching tube are connected with the output terminal of the first clock-controlled inverter.

5. The gate driving circuit according to claim 3, wherein, the second clock-controlled inverter includes a fifth P type switching tube, a sixth P type switching tube, a seventh P type switching tube, an eighth P type switching tube, a fifth N type switching tube, a sixth N type switching tube, a seventh N type switching tube, and an eighth N type switching tube;

a control terminal of the fifth P type switching tube is connected with a control terminal of the eighth P type switching tube, and is inputted with the first control signal; a control terminal of the sixth P type switching tube is connected with a control terminal of the seventh P type switching tube, and is inputted with the first clock signal, wherein, a first transmission terminal of the fifth P type switching tube and a first transmission terminal of the seventh P type switching tube are inputted with a high voltage reference level; a first transmission terminal of the sixth P type switching tube is connected with a second transmission terminal of the fifth P type switching tube; a first transmission terminal of the eighth P type switching tube is connected with a second transmission terminal of the seventh P type switching tube; a second transmission terminal of the sixth P type switching tube and a second transmission terminal of the eighth P type switching tube are connected with the output terminal of the second clock-controlled inverter; and a control terminal of the fifth N type switching tube is connected with a control terminal of the eighth N type switching tube, and is inputted with the second clock signal; a control terminal of the sixth N type switching tube is connected with a control terminal of the seventh N type switching tube, and is inputted with the first control signal; a first transmission terminal of the sixth N type switching tube and a first transmission terminal of the eighth N type switching tube are inputted with a low voltage reference level; a first transmission terminal of the fifth N type switching tube is connected with a second transmission terminal of the sixth N type switching tube; a first transmission terminal of the seventh N type switching tube is connected with a second transmission terminal of the eighth N type switching tube; a second transmission terminal of the fifth N type switching tube and a second transmission terminal of the seventh N type switching tube are connected with the output terminal of the second clock-controlled inverter.

6. The gate driving circuit according to claim 3, wherein, the signal processing circuit is a NAND gate, a first input terminal of the NAND gate circuit is inputted with the first control signal, a second input terminal of the NAND gate circuit is inputted with the third clock signal, an output terminal of the NAND gate circuit outputs the second control signal, and the NAND gate circuit includes two switching modules disposed among the output terminal of the NAND gate circuit and the reference voltage level.

7. The gate driving circuit according to claim 6, wherein,
the signal processing circuit includes a ninth P type switching tube, a tenth P type switching tube, a ninth N type switching tube, a tenth N type switching tube, an eleventh N type switching tube, and a twelfth N type switching tube;
a control terminal of the ninth P type switching tube is inputted with the first control signal, a control terminal of the tenth P type switching tube is inputted with the third clock signal, a first transmission terminal of the ninth P type switching tube and a first transmission terminal of the tenth P type switching tube is inputted with a high reference voltage level, a second transmission of the ninth P type switching tube and a second transmission terminal of the tenth P type switching tube are connected with the output terminal of the NAND gate; and
a control terminal of the ninth N type switching tube is connected with a control terminal of the twelfth switching tube, and is inputted with the first control signal; a control terminal of the tenth N type switching tube is connected with a control terminal of the eleventh N type switching tube, and is inputted with the third clock signal; a first transmission terminal of the tenth N type switching tube and a first transmission terminal of the twelfth N type switching tube are inputted with a low voltage reference level; a first transmission terminal of the ninth N type switching tube is connected with a second transmission terminal of the tenth N type switching tube; a first transmission terminal of the eleventh N type switching tube is connected with a second transmission terminal of the twelfth N type switching tube; a second transmission terminal of the ninth N type switching tube and a second transmission terminal of the eleventh N type switching tube are connected with the output terminal of the NAND gate.

8. The gate driving circuit according to claim 2, wherein, the signal processing circuit is a NAND gate, a first input terminal of the NAND gate circuit is inputted with the first control signal, a second input terminal of the NAND gate circuit is inputted with the third clock signal, an output terminal of the NAND gate circuit outputs the second control signal, and the NAND gate circuit includes two switching modules disposed among the output terminal of the NAND gate circuit and a reference voltage level.

9. The gate driving circuit according to claim 8, wherein,
the signal processing circuits include a first P type switching tube, a second P type switching tube, a first N type switching tube, a second N type switching tube, a third N type switching tube, and a fourth N type switching tube;
a control terminal of the first P type switching tube is inputted with the first control signal, a control terminal of the second P type switching tube is inputted with the third clock signal, a first transmission terminal of the first P type switching tube and a first transmission terminal of the second P type switching tube is inputted with a high reference voltage level, a second transmission of the first P type switching tube and a second transmission terminal of the second P type switching tube are connected with the output terminal of the NAND gate; and
a control terminal of the first N type switching tube is connected with a control terminal of the fourth N switching tube, and is inputted with the first control signal; a control terminal of the second N type switching tube is connected with a control terminal of the third N type switching tube, and is inputted with the third clock signal; a first transmission terminal of the second N type switching tube and a first transmission terminal of the fourth N type switching tube are inputted with a low voltage reference level; a first transmission terminal of the first N type switching tube is connected with a second transmission terminal of the second N type switching tube; a first transmission terminal of the third N type switching tube is connected with a second transmission terminal of the fourth N type switching tube; a second transmission terminal of the first N type switching tube and a second transmission terminal of the third N type switching tube are connected with the output terminal of the NAND gate.

10. The gate driving circuit according to claim 2, wherein, the output buffering circuit includes second odd-numbered inverters connected sequentially in series; an input terminal of the second inverters close to the signal processing circuit is inputted with the second control signal, an output terminal of the second inverters away from the signal processing circuit outputs the scanning driving signal of the current stage.

11. A liquid crystal display including multiple cascade gate driving circuits, and the gate driving circuit comprises: an input and latch circuit, a signal processing circuit electrically connected with the input and latch circuit and an output buffering circuit electrically connected with the signal processing circuit;
wherein, the input and latch circuit outputs a first control signal according to a scanning driving signal of a previous stage, a first clock signal and a second clock signal phase-inverted with respect to the first clock signal; the signal processing circuit outputs a second control signal according to the first control signal and a third clock signal; the output buffering circuit outputs a scanning driving signal of a current stage according to the second control signal; and wherein, the input and latch circuit or the signal processing circuit includes two switch modules which are disposed in parallel, wherein each switch module includes two switching tubes disposed in series, control terminals of the two switching tubes of one of the two switch modules are crosswise connected with control terminals of the two switching tubes of the other of the two switch modules.

12. The liquid crystal display according to claim 11, wherein, the input and latch circuit includes: a first clock-controlled inverter, a second clock-controlled inverter and a first inverter; a positive phase control terminal of the first clock-controlled inverter is inputted with the first clock signal, a negative phase control terminal of the first clock-controlled inverter is inputted with the second clock signal; an input terminal of the first clock-controlled inverter is inputted with the scanning driving signal of the previous stage; an output terminal of the first clock-controlled inverter is connected with an output terminal of the second clock-controlled inverter; a positive phase control terminal of the second clock-controlled inverter is inputted with the second clock signal; a negative phase control terminal of the second clock-controlled inverter is inputted with the first clock signal; an input terminal of the first inverter is connected with the output terminal of the first clock-controlled inverter and the output terminal of the second clock-controlled inverter; an output terminal of the first inverter is connected with an input terminal of the second clock-controlled inverter, and outputs the first control signal, wherein, at least one of the first clock-controlled inverter and the second clock-controlled inverter is disposed with the two switch modules connected between at least one output terminal of the first clock-controlled inverter and the second clock-controlled inverter and a reference voltage level.

13. The liquid crystal display according to claim 12, wherein,
the first clock-controlled inverter includes a first P type switching tube, a second P type switching tube, a third P type switching tube, a fourth P type switching tube, a first N type switching tube, a second N type switching tube, a third N type switching tube and a fourth N type switching tube;
a control terminal of the first P type switching tube is connected with a control terminal of the fourth P type switching tube, and is inputted with the second clock signal; a control terminal of the second P type switching tube is connected with a control terminal of the third P type switching tube, and is inputted with the scanning driving signal of the previous stage; a first transmission terminal of the first P type switching tube and a first transmission terminal of the third P type switching tube are inputted with a high voltage reference level; a first transmission terminal of the second P type switching tube is connected with a second transmission terminal of the first P type switching tube; a first transmission terminal of the fourth P type switching tube is connected with a second transmission terminal of the third P type switching tube; a second transmission terminal of the second P type switching tube and a second transmission terminal of the fourth P type switching tube are connected with the output terminal of the first clock-controlled inverter; and
a control terminal of the first N type switching tube is connected with a control terminal of the fourth N type switching tube, and is inputted with scanning driving signal of the previous stage; a control terminal of the second N type switching tube is connected with a control terminal of the third N type switching tube, and is inputted with the first clock signal; a first transmission terminal of the second N type switching tube and a first transmission terminal of the fourth N type switching tube are inputted with a low voltage reference level; a first transmission terminal of the first N type switching tube is connected with a second transmission terminal of the second N type switching tube; a first transmission terminal of the third N type switching tube is connected with a second transmission terminal of the fourth N type switching tube; a second transmission terminal of the first N type switching tube and a second transmission terminal of the third N type switching tube are connected with the output terminal of the first clock-controlled inverter.

14. The liquid crystal display according to claim 12, wherein
the second clock-controlled inverter includes a fifth P type switching tube, a sixth P type switching tube, a seventh P type switching tube, an eighth P type switching tube, a fifth N type switching tube, a sixth N type switching tube, a seventh N type switching tube, and an eighth N type switching tube;
a control terminal of the fifth P type switching tube is connected with a control terminal of the eighth P type switching tube, and is inputted with the first control signal; a control terminal of the sixth P type switching tube is connected with a control terminal of the seventh P type switching tube, and is inputted with the first clock signal, wherein, a first transmission terminal of the fifth P type switching tube and a first transmission terminal of the seventh P type switching tube are inputted with a high voltage reference level; a first transmission terminal of the sixth P type switching tube is connected with a second transmission terminal of the fifth P type switching tube; a first transmission terminal of the eighth P type switching tube is connected with a second transmission terminal of the seventh P type switching tube; a second transmission terminal of the sixth P type switching tube and a second transmission terminal of the eighth P type switching tube are connected with the output terminal of the second clock-controlled inverter; and
a control terminal of the fifth N type switching tube is connected with a control terminal of the eighth N type switching tube, and is inputted with the second clock signal; a control terminal of the sixth N type switching tube is connected with a control terminal of the seventh N type switching tube, and is inputted with the first control signal; a first transmission terminal of the sixth N type switching tube and a first transmission terminal of the eighth N type switching tube are inputted with a low voltage reference level; a first transmission terminal of the fifth N type switching tube is connected with a second transmission terminal of the sixth N type switching tube; a first transmission terminal of the seventh N type switching tube is connected with a second transmission terminal of the eighth N type switching tube; a second transmission terminal of the fifth N type switching tube and a second transmission terminal of the seventh N type switching tube are connected with the output terminal of the second clock-controlled inverter.

15. The liquid crystal display according to claim 14, wherein
the signal processing circuit is a NAND gate, a first input terminal of the NAND gate circuit is inputted with the first control signal, a second input terminal of the NAND gate circuit is inputted with the third clock signal, an output terminal of the NAND gate circuit outputs the second control signal, and the NAND gate circuit includes two switching modules disposed among the output terminal of the NAND gate circuit and the reference voltage level.

16. The liquid crystal display according to claim 15, wherein
the signal processing circuit includes a ninth P type switching tube, a tenth P type switching tube, a ninth N type switching tube, a tenth N type switching tube, an eleventh N type switching tube, and a twelfth N type switching tube;
a control terminal of the ninth P type switching tube is inputted with the first control signal, a control terminal of the tenth P type switching tube is inputted with the third clock signal, a first transmission terminal of the ninth P type switching tube and a first transmission terminal of the tenth P type switching tube is inputted with the high voltage reference level, a second transmission of the ninth P type switching tube and a second transmission terminal of the tenth P type switching tube are connected with the output terminal of the NAND gate; and
a control terminal of the ninth N type switching tube is connected with a control terminal of the twelfth switching tube, and is inputted with the first control signal; a control terminal of the tenth N type switching tube is connected with a control terminal of the eleventh N type switching tube, and is inputted with the third clock signal; a first transmission terminal of the tenth N type switching tube and a first transmission terminal of the twelfth N type switching tube are inputted with the low voltage reference level; a first transmission terminal of the ninth N type switching tube is connected with a second transmission terminal of the tenth N type switching tube; a first transmission terminal of the eleventh N type switching tube is connected with a second transmission terminal of the twelfth N type switching tube; a second transmission terminal of the ninth N type switching tube and a second transmission terminal of the eleventh N type switching tube are connected with the output terminal of the NAND gate.

17. The gate driving circuit according to claim 11, wherein, the signal processing circuit is a NAND gate, a first input terminal of the NAND gate circuit is inputted with the first control signal, a second input terminal of the NAND gate circuit is inputted with the third clock signal, an output terminal of the NAND gate circuit outputs the second control signal, and the NAND gate circuit includes two switching modules disposed among the output terminal of the NAND gate circuit and a reference voltage level.

18. The gate driving circuit according to claim 17, wherein,
the signal processing circuits include a first P type switching tube, a second P type switching tube, a first N type switching tube, a second N type switching tube, a third N type switching tube, and a fourth N type switching tube;
a control terminal of the first P type switching tube is inputted with the first control signal, a control terminal of the second P type switching tube is inputted with the third clock signal, a first transmission terminal of the first P type switching tube and a first transmission terminal of the second P type switching tube is inputted with a high reference voltage level, a second transmission of the first P type switching tube and a second transmission terminal of the second P type switching tube are connected with the output terminal of the NAND gate; and
a control terminal of the first N type switching tube is connected with a control terminal of the fourth N switching tube, and is inputted with the first control signal; a control terminal of the second N type switching tube is connected with a control terminal of the third N type switching tube, and is inputted with the third clock signal; a first transmission terminal of the second N type switching tube and a first transmission terminal of the fourth N type switching tube are inputted with a low voltage reference level; a first transmission terminal of the first N type switching tube is connected with a second transmission terminal of the second N type switching tube; a first transmission terminal of the third N type switching tube is connected with a second transmission terminal of the fourth N type switching tube; a second transmission terminal of the first N type switching tube and a second transmission terminal of the third N type switching tube are connected with the output terminal of the NAND gate.

19. The gate driving circuit according to claim 11, wherein,
the output buffering circuit includes second odd-numbered inverters connected sequentially in series; an input terminal of the second inverters close to the signal processing circuit is inputted with the second control signal, an output terminal of the second inverters away from the signal processing circuit outputs the scanning driving signal of the current stage.

* * * * *